United States Patent
Sakamoto et al.

(10) Patent No.: US 11,056,617 B2
(45) Date of Patent: Jul. 6, 2021

(54) MANUFACTURING METHOD OF LIGHT-EMITTING DEVICE HAVING A RECESS DEFINED BY A BASE AND LATERAL SURFACES OF A FIRST AND A SECOND WALL

(71) Applicant: NICHIA CORPORATION, Anan (JP)

(72) Inventors: Masahiro Sakamoto, Tokushima (JP); Akira Watanabe, Fujiyoshida (JP)

(73) Assignee: NICHIA CORPORATION, Anan (JP)

( * ) Notice: Subject to any disclaimer, the term of this patent is extended or adjusted under 35 U.S.C. 154(b) by 15 days.

(21) Appl. No.: 16/582,968

(22) Filed: Sep. 25, 2019

(65) Prior Publication Data

US 2020/0105978 A1 Apr. 2, 2020

(30) Foreign Application Priority Data

Sep. 27, 2018 (JP) .............................. JP2018-182778

(51) Int. Cl.
*H01L 33/48* (2010.01)
*H01L 33/62* (2010.01)
(Continued)

(52) U.S. Cl.
CPC .......... *H01L 33/486* (2013.01); *H01L 33/505* (2013.01); *H01L 33/56* (2013.01); *H01L 33/60* (2013.01); *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC .................. H01L 33/486; H01L 33/60; H01L 2933/0033; H01L 33/62; H01L 33/56; H01L 33/505; H01L 2933/0058; H01L 2933/0066; H01L 2933/005; H01L 2933/0041

See application file for complete search history.

(56) References Cited

U.S. PATENT DOCUMENTS 10,431,724 B2 * 10/2019 Ikeda ...................... H01L 33/58
2002/0187570 A1 12/2002 Fukasawa et al.
(Continued)

FOREIGN PATENT DOCUMENTS

JP 2001-118865 A 4/2001
JP 2002-368281 A 12/2002
(Continued)

*Primary Examiner* — Quoc D Hoang
(74) *Attorney, Agent, or Firm* — Birch, Stewart, Kolasch & Birch, LLP

(57) ABSTRACT

A manufacturing method of a light-emitting device, includes the steps of: preparing a substrate including a base, a first wall formed on an upper surface of the base, and a recess defined by a lateral surface of the first wall as an inside lateral surface and the upper surface of the base as a bottom surface; mounting a light-emitting element on the bottom surface of the recess; disposing a sealing member which covers the light-emitting element and the first wall; forming a groove section extending from an upper surface of the sealing member to the first wall by removing the sealing member on the first wall; disposing a second wall inside the groove section; and cutting the second wall and the substrate at a position including the second wall.

19 Claims, 3 Drawing Sheets

(51) Int. Cl.
*H01L 33/56* (2010.01)
*H01L 33/50* (2010.01)
*H01L 33/60* (2010.01)

(56) References Cited

U.S. PATENT DOCUMENTS

| | | |
|---|---|---|
| 2010/0258830 A1 | 10/2010 | Ide et al. |
| 2011/0114969 A1* | 5/2011 | Lee .................. H01L 33/60 |
| | | 257/88 |
| 2014/0151734 A1 | 6/2014 | Ito et al. |
| 2015/0311405 A1 | 10/2015 | Oyamada et al. |

FOREIGN PATENT DOCUMENTS

| | | |
|---|---|---|
| JP | 2006-245626 A | 9/2006 |
| JP | 2007-59492 A | 3/2007 |
| JP | 5611492 B1 | 10/2014 |
| WO | WO 2009/066430 A1 | 5/2009 |
| WO | WO 2013/011628 A1 | 1/2013 |

\* cited by examiner

[FIG.1A]
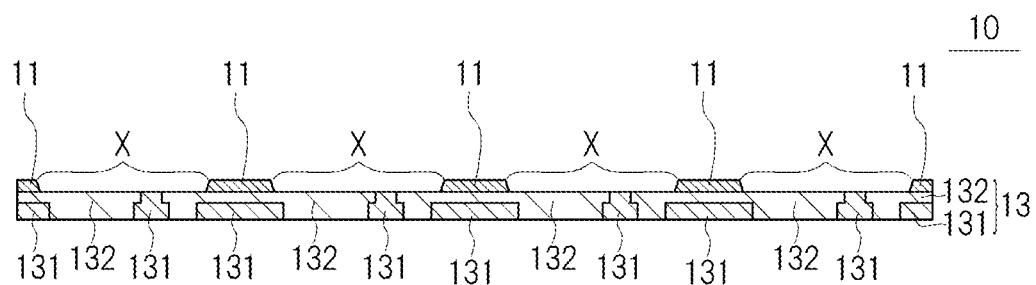
[FIG.1B]
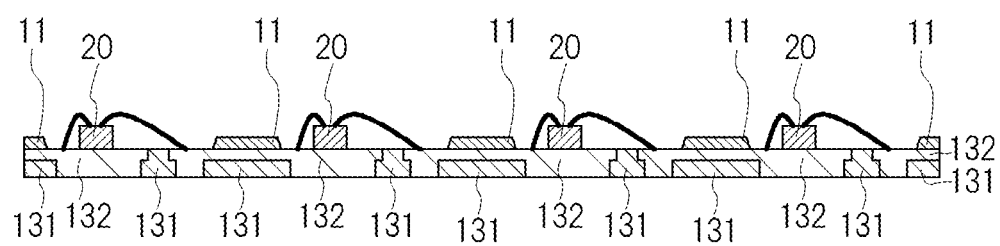
[FIG.1C]
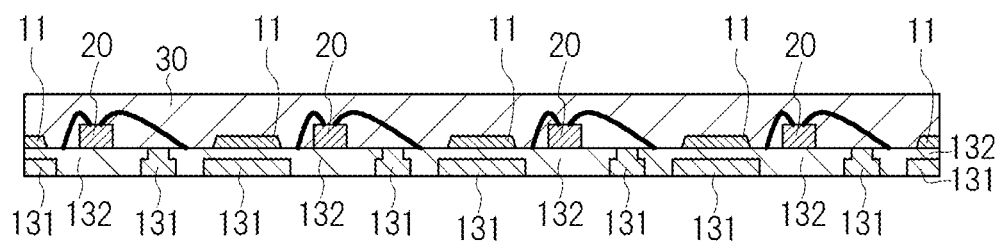

[FIG.1D]
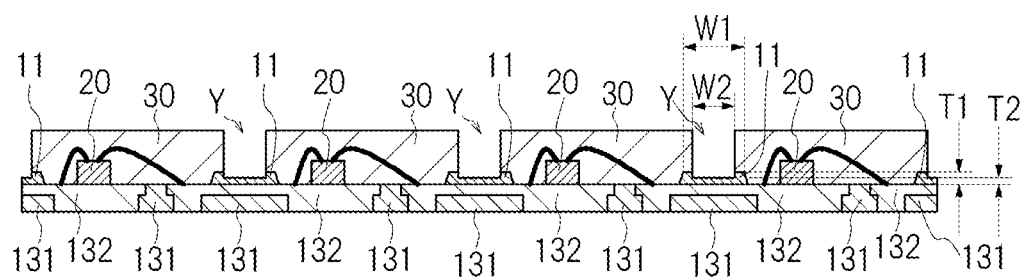
[FIG.1E]
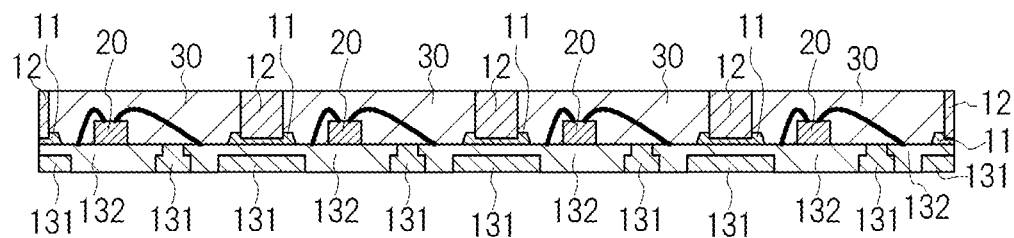
[FIG.1F]
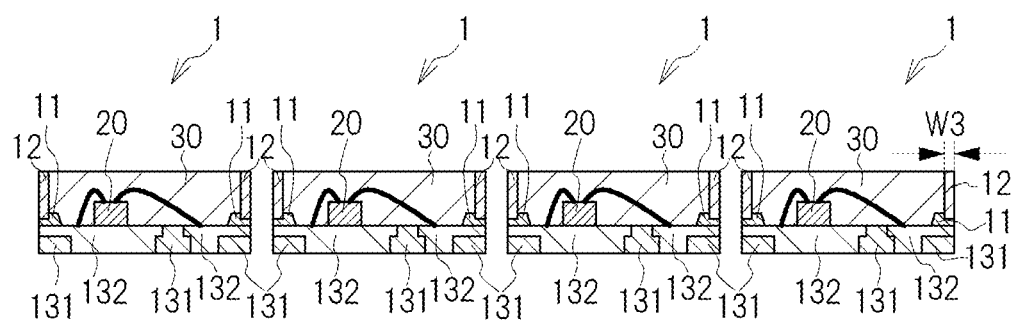

[FIG.2A]
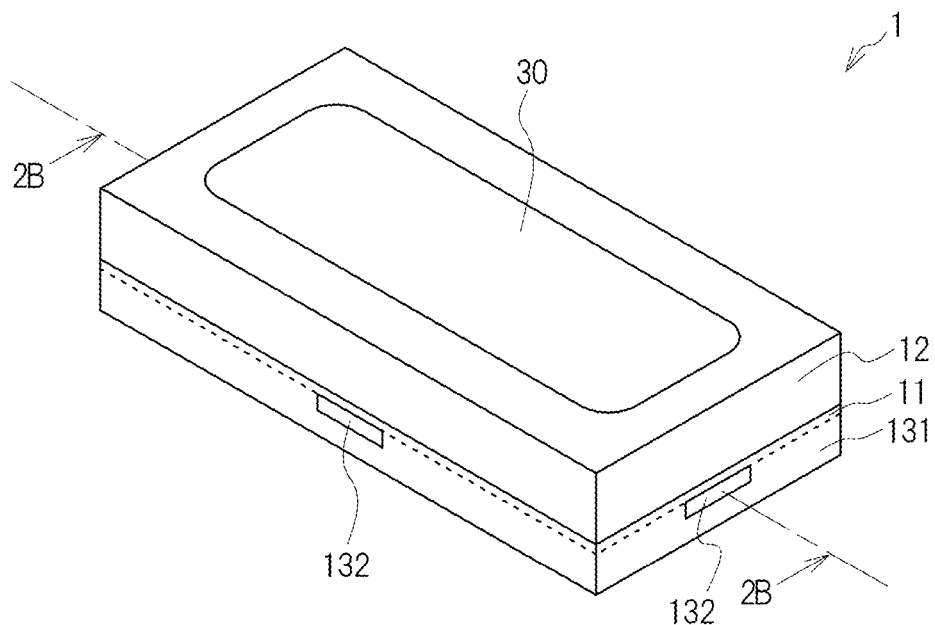
[FIG.2B]
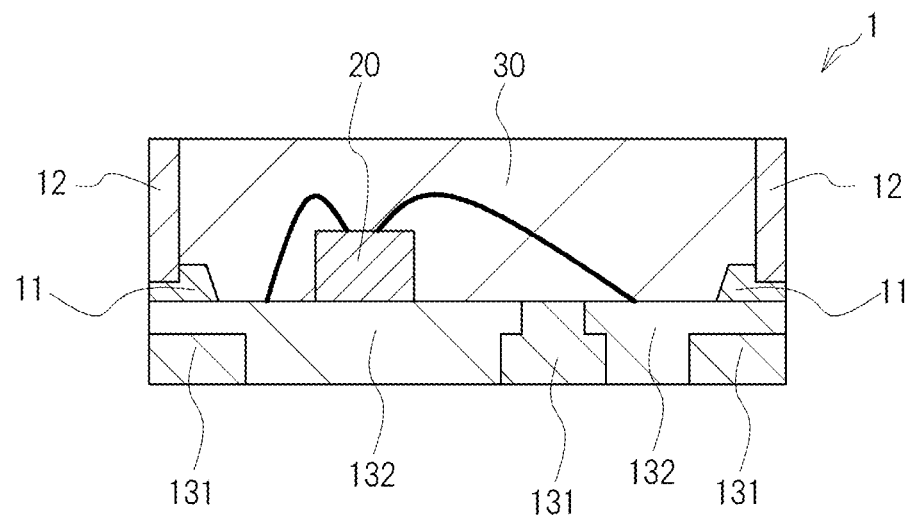

MANUFACTURING METHOD OF LIGHT-EMITTING DEVICE HAVING A RECESS DEFINED BY A BASE AND LATERAL SURFACES OF A FIRST AND A SECOND WALL

CROSS-REFERENCE TO RELATED APPLICATIONS

This application claims priority to Japanese Patent Application No. 2018-182778, filed on Sep. 27, 2018, the entire contents of which are incorporated herein by reference.

BACKGROUND

The present invention relates to a light-emitting device and a manufacturing method of the light-emitting device.

Light-emitting devices using a light-emitting element such as an LED are capable of readily producing high light emission efficiency and the like and are therefore widely used in a wide variety of devices including backlights of displays and lighting devices. A manufacturing method of a light-emitting device has been known in which, for the purpose of miniaturizing a light-emitting device, the light-emitting element is mounted, and then a light-reflecting resin is formed so as to surround the light-emitting element. For example, a manufacturing method of a light-emitting diode is proposed which includes: a first step of covering an LED element on a substrate with a transmissive resin; a second step of removing, after the transmissive resin is cured, the transmissive resin in an intermediate section of the LED element with a dicing blade; a third step of filling a groove section formed by the second step with a light-reflecting resin; and a fourth step of cutting, after the light-reflecting resin is cured, the substrate so that the light-reflecting resin is retained on a periphery of the LED element and the substrate is separated into individual light-emitting diodes (refer to Japanese Patent Application Laid-open No. 2002-368281).

SUMMARY

With the manufacturing method described above, a shape of a light-reflecting resin wall may change due to abrasion of a blade when forming the groove. In consideration thereof, an object of the present disclosure is to provide a manufacturing method that is capable of efficiently manufacturing a light-emitting device configured so as to enable miniaturization, and to provide a light-emitting device that can be miniaturized.

The problem described above can be solved by, for example, the following means.

A manufacturing method of a light-emitting device, including the steps of:

preparing a substrate provided with a base, a first wall formed on an upper surface of the base, and a recess defined by a lateral surface of the first wall as an inside lateral surface and the upper surface of the base as a bottom surface;

mounting a light-emitting element on the bottom surface of the recess;

disposing a sealing member which covers the light-emitting element and the first wall;

forming a groove section extending from an upper surface of the sealing member to the first wall by removing the sealing member on the first wall;

disposing a second wall inside the groove section; and cutting the second wall and the substrate at a position including the second wall.

BRIEF DESCRIPTION OF THE DRAWINGS

FIG. 1A is a schematic sectional view illustrating a step of preparing a substrate in a manufacturing method according to a first embodiment;

FIG. 1B is a schematic sectional view illustrating a step of mounting a light-emitting element in the manufacturing method according to the first embodiment;

FIG. 1C is a schematic sectional view illustrating a step of disposing a sealing member in the manufacturing method according to the first embodiment;

FIG. 1D is a schematic sectional view illustrating a step of forming a groove section in the manufacturing method according to the first embodiment;

FIG. 1E is a schematic sectional view illustrating a step of disposing a second wall in the manufacturing method according to the first embodiment;

FIG. 1F is a schematic sectional view illustrating a step of cutting the second wall and the substrate in the manufacturing method according to the first embodiment;

FIG. 2A is a schematic perspective view of a light-emitting device according to the first embodiment; and FIG. 2B is a sectional view taken along 2B-2B in FIG. 2A.

DETAILED DESCRIPTION

Manufacturing Method of Light-Emitting Device 1 According to First Embodiment

FIGS. 1A to 1F are schematic sectional views illustrating a manufacturing method of a light-emitting device 1 according to the first embodiment. As shown in FIGS. 1A to 1F, the manufacturing method of the light-emitting device 1 according to the first embodiment includes the steps of: preparing a substrate 10 including a base 13, a first wall 11 formed on an upper surface of the base 13, and a recess X having a lateral surface of the first wall 11 as an inside lateral surface and the upper surface of the base 13 as a bottom surface; mounting a light-emitting element 20 on the bottom surface of the recess X; disposing a sealing member 30 which covers the light-emitting element 20 and the first wall 11; forming a groove section Y extending from an upper surface of the sealing member 30 to the first wall 11 by removing the sealing member 30 on the first wall 11; disposing a second wall 12 inside the groove section Y; and cutting the second wall 12 and the substrate 10 at a position including the second wall 12. Hereinafter, each step will be described.

Step of Preparing Substrate 10

First, as shown in FIG. 1A, the substrate 10 including the base 13 and the first wall 11 is prepared. The first wall 11 is formed in advance on an upper surface of the base 13. Due to the substrate 10 including the base 13 and the first wall 11, the substrate 10 includes the recess X having a lateral surface of the first wall 11 as an inside lateral surface and the upper surface of the base 13 as a bottom surface. It should be noted that cases where the first wall 11 is formed on the upper surface of the base 13 includes, in addition to a case where a lower surface of the first wall 11 is in contact with the upper surface of the base 13, a case where an adhesive which bonds the lower surface of the first wall 11 and the upper surface of the base 13 to each other is interposed therebetween and a case where the first wall 11 and the base 13 are integrally formed as will be described later.

The base 13 includes, for example, a supporting section 131 and an electrode section 132. When the base 13 includes the supporting section 131 and the electrode section 132, an upper surface of the supporting section 131 and/or an upper surface of the electrode section 132 constitutes the upper surface of the base 13.

The supporting section 131 is a section which supports the electrode section 132 and is fabricated using, for example, an insulating member such as a resin molded body, ceramics, or glass epoxy, or a metal member having an insulating member formed on a surface thereof.

The electrode section 132 is a section which is electrically connected to the light-emitting element 20 to be mounted to a bottom surface of the recess X and is made using, for example, copper, iron, silver, gold, aluminum, or an alloy thereof. In particular, a member including copper as a main material can be preferably used as the electrode section 132 from the perspectives of thermal conductivity, strength, and the like.

At least a part of the electrode section 132 is exposed on the bottom surface of the recess X. Plating using gold, silver, or the like may be applied to a surface of the electrode section 132 to be exposed on the bottom surface of the recess X in order to increase bondability with a light-reflecting member and/or a die bond member. In this case, the electrode section 132 has a base layer and a plating layer made of the materials described earlier. Since the groove section Y (to be described later) reaches the first wall 11 but does not reach the base 13, the formation of the groove section Y does not cause the plating to peel away and expose the base layer of the electrode section 132. Therefore, applying the plating effectively prevents exposure of the base layer and oxidation of the electrode section 132 even when the base layer includes a metal layer of copper or the like which is relatively susceptible to oxidation. It should be noted that the metal used for the plating may differ in accordance with a purpose of applying the plating or, in other words, in accordance with a region in which the plating is to be applied.

The upper surface of the first wall 11 is preferably lower in height than the upper surface of the light-emitting element 20 to be mounted to the bottom surface of the recess X. Accordingly, since various tools are less likely to come into contact with the first wall 11 in the step of mounting the light-emitting element 20 to be described later, a mountable region of the light-emitting element 20 on the bottom surface of the recess X (in other words, in a region enclosed by the first wall 11 in a plan view) can be increased. Various tools refer to, for example, a tool for holding the light-emitting element 20 such as a capillary or a jig and a tool which is used when performing wire bonding and which electrically connects the light-emitting element 20 and the substrate 10 (specifically, the electrode section 132 exposed on the bottom surface of the recess X) to each other. Whether or not the upper surface is low can be determined on the basis of, for example, a length from the upper surface of the base 13 (the bottom surface of the recess X) in a vertical direction of the substrate 10.

The recess X may be provided singly or in plurality. The recess X is opened toward an upper side of the substrate 10. An inside lateral surface of the recess X preferably includes an inclined surface P which is inclined outward so that the opening of the recess X is larger than the bottom surface of the recess X. In other words, while examples of a shape of the first wall 11 in a sectional view include a semicircular shape, a semi-elliptical shape, and a polygonal shape, among these shapes, a trapezoidal shape and a semicircular shape are particularly preferable. Accordingly, the various tools described above are less likely to come into contact with the first wall 11 even when the upper surface of the first wall 11 is higher than the upper surface of the light-emitting element 20. And the various tools described above are further less likely to come into contact with the first wall 11 when the upper surface of the first wall 11 is lower in height than the upper surface of the light-emitting element 20. Therefore, the mountable region of the light-emitting element 20 can be further increased.

The first wall 11 need only be formed in a shape that causes the substrate 10 to have the recess X and, for example, the first wall 11 is formed in a grid pattern in a plan view on the upper surface of the base 13. In this case, for example, the first wall 11 has a plurality of walls that extend in a row direction and a plurality of walls that extend in a column direction in a plan view and is formed so that the former walls and the latter walls perpendicularly intersect each other (including cases where it can be regarded that the former walls and the latter walls perpendicularly intersect each other). Disposing the first wall 11 with such a grid pattern enables a plurality of the recesses X with sizes and shapes (internal spaces, opening areas, and the like of the recesses X) which are uniform (including cases where it can be regarded that the sizes and shapes are uniform) to be readily formed on the base 13 without wasting space on the upper surface of the base 13.

As a material of the first wall 11, insulating materials can be used. Examples of insulating materials include ceramics, resins, derivatives, pulp, glass, and composite materials. As far as resins are concerned, any resin being used in the relevant field can be used. Specific examples include an epoxy resin, a triazine derivative epoxy resin, a modified epoxy resin, a silicone resin, a modified silicone resin, an acrylate resin, and a urethane resin. While the first wall 11 may be formed of a different material from the base 13 (particularly, the supporting section 131; the same applies to the remainder of the present paragraph), the first wall 11 is preferably integrally formed with the base 13 using the same material as the base 13 in order to ensure adhesion between the first wall 11 and the base 13. In this manner, even when the first wall 11 and the base 13 are integrally formed, the base 13 and the first wall 11 are understood to be conceptually separate and the first wall 11 is considered to be formed on the upper surface of the base 13 in the present embodiment.

The lateral surface of the first wall 11 (in other words, the inside lateral surface of the recess X) preferably has high optical reflectance. Accordingly, the optical reflectance of the recess X which houses the light-emitting element 20 can be readily increased. Cases where the first wall 11 has high optical reflectance include, in addition to a case where a material of the first wall 11 itself has high optical reflectance such as when ceramics, resins, or the like are used as the first wall 11, a case where the first wall 11 has high optical reflectance due to the material of the first wall 11 containing a light-reflecting substance. Examples of light-reflecting substances include titanium oxide, silicon oxide, zirconium oxide, potassium titanate, alumina, aluminum nitride, boron nitride, mullite, and glass fillers.

In the present embodiment, the substrate 10 in which the first wall 11 is formed in advance on the upper surface of the base 13 is to be prepared in the present step. Alternatively, the preparation by the present step can be performed by first arranging the base 13 which does not include the first wall 11 and subsequently arranging the first wall 11 on the base 13.

From the perspective of adhesion between the first wall 11 and the base 13 and/or simplification of a manufacturing process, a lead frame with a resin molded body created by integrally molding a lead frame and a resin member is preferably used for the substrate 10. In this case, the lead frame constitutes the electrode section 132 and the resin member constitutes the supporting section 131 and the first wall 11. Using such a lead frame with a resin molded body enables the electrode section 132, the supporting section 131, and the first wall 11 to be integrally molded. As the resin member, those that are known in the art can be used. Specific examples include an epoxy resin, a modified epoxy resin, a silicone resin, a modified silicone resin, an unsaturated polyester resin, a phenolic resin, a polycarbonate resin, an acrylic resin, a trimethylpentene resin, a polynorbornene resin, and a hybrid resin or the like containing one or more of these resins.

Step of Mounting Light-Emitting Element 20

Next, as shown in FIG. 1B, the light-emitting element 20 is mounted on the bottom surface of the recess X. When the substrate 10 has the electrode section 132, the light-emitting element 20 is mounted on the electrode section 132. The light-emitting element 20 may be provided singly or in plurality. One or a plurality of light-emitting elements 20 may be arranged inside one recess X. Electric connection between the light-emitting element 20 and the substrate 10 (the electrode section 132) can be performed by, for example, a flip chip system or a wire bonding system. In the present embodiment, it is assumed that the electric connection is performed by a wire bonding system. When using wire bonding, the step of mounting the light-emitting element 20 includes a step of connecting the light-emitting element 20 and the electrode section 132 to each other with a wire. Connecting the light-emitting element 20 and the electrode section 132 to each other with a wire refers to electrically connecting, with a wire, the electrode section 132 disposed on the substrate 10 and one or both of a pair of electrodes of the light-emitting element 20 to each other. When only one of the pair of electrodes of the light-emitting element 20 is connected by a wire, the other of the pair of electrodes of the light-emitting element 20 is connected to the electrode section 132 by, for example, die bonding. The wire need only be a member capable of electrically connecting electrodes of the light-emitting element 20 and the electrode section 132 of the substrate 10 to each other, and examples thereof include wires using a metal such as gold, silver, copper, platinum, or aluminum or an alloy of such metals. In the present step, a tool for holding the light-emitting element 20 such as a capillary or a jig and a tool which is used when performing wire bonding and which electrically connects the light-emitting element 20 and the electrode section 132 to each other can be used.

A semiconductor light-emitting element such as a light-emitting diode can be used as the light-emitting element 20. As the light-emitting element 20, light-emitting elements with an emission wavelength in an arbitrary region ranging from an ultraviolet region to an infrared region can be suitably selected and used depending on the purpose. A light-emitting element in which a stack structure including a light-emitting layer made of various semiconductors including a nitride semiconductor (examples: InN, AlN, GaN, InGaN, AlGaN, and InGaAlN), a III-V group compound semiconductor, and a II-VI group compound semiconductor is formed on a growth substrate such as a sapphire substrate or a GaN substrate can be used as the light-emitting element 20. For example, in the light-emitting element 20, a pair of positive and negative electrodes may be provided on a side of a same surface or the positive electrode and the negative electrode of the pair of electrodes may be respectively provided on opposing surfaces. In the present embodiment, it is assumed that the light-emitting element 20 has the pair of positive and negative electrodes provided on the side of a same surface and that both of the electrodes are connected to the electrode section 132 by wires.

Step of Disposing Sealing Member 30

Next, as shown in FIG. 1C, the sealing member 30 for covering the light-emitting element 20 and the first wall 11 is disposed. The sealing member 30 is a member for covering the light-emitting element 20 and wires in order to protect the light-emitting element 20 and the wires from dust, moisture, external forces, and the like. The sealing member 30 is preferably a member using a material that transmits light of the light-emitting element 20. Examples of specific materials include resin materials such as a silicone resin and an epoxy resin. A sealing resin can be disposed by methods such as potting and compression molding.

The sealing member 30 is preferably made using a resin material containing a phosphor. Phosphors are made of a material which absorbs at least a part of the light from the light-emitting element 20 and which emits light with a different wavelength. For example, when a blue light-emitting element or an ultraviolet light-emitting element is used as the light-emitting element 20, specific examples of the material of a phosphor include, as phosphors that are excitable by these light-emitting elements, a cerium-activated yttrium aluminum garnet-based phosphor (YAG:Ce), a cerium-activated lutetium aluminum garnet-based phosphor (LAG:Ce), a europium and/or chromium-activated nitrogen-containing calcium aluminosilicate-based phosphor (CaO—$Al_2O_3$—$SiO_2$:Eu), a europium-activated silicate-based phosphor (($Sr,Ba)_2SiO_4$:Eu), nitride-based phosphors such as a β-SiAlON phosphor, a CASN-based phosphor, and a SCASN-based phosphor, a KSF-based phosphor ($K_2SiF_6$:Mn), sulfide-based phosphors, and quantum dot phosphors. Combining these phosphors with a blue light-emitting element or an ultraviolet light-emitting element enables a light-emitting device with a desired emission color (for example, a white-based light-emitting device) to be obtained.

In addition to a phosphor, the sealing member 30 may be made using a resin material containing a filler such as a colorant or a light diffusion agent as desired.

Step of Forming Groove Section Y

Next, as shown in FIG. 1D, by removing the sealing member 30 on the first wall 11, the groove section Y extending from the upper surface of the sealing member 30 to the first wall 11 is formed. For example, a blade can be used to remove the sealing member 30. Due to the removal of a part of the upper surface of the first wall 11, the bottom surface of the groove section Y is preferably positioned lower in height than the upper surface of the first wall 11 (more accurately, a position where the upper surface of the first wall 11 had been present) and, in particular, the bottom surface of the groove section Y is preferably positioned at a height T2 which is around half of a height T1 of the first wall 11. In this case, the groove section Y is preferably a groove created by removing only a part of the upper surface of the first wall 11. Although a tip of the groove section Y (in other words, the bottom surface of the groove section Y) is formed by a blade edge portion that is susceptible to the effect of deterioration or abrasion of the blade, forming the bottom surface of the groove in the first wall prevents a shape of the bottom surface of the groove from affecting a shape of an inside lateral surface of a recess in a light-emitting device that is a final product. Therefore, light-emitting devices with a stable shape can be manufactured in an efficient manner. In addition, since a contact area between the first wall 11 and the second wall 12 (to be described later) increases, adhesion between the first wall 11 and the second wall 12 preferably increases. Furthermore, a width W2 of the groove section Y is preferably about ½ of a width W1 of the first wall 11. Even in this case, since the contact area between the first wall 11 and the second wall 12 increases, the adhesion between the first wall 11 and the second wall 12 preferably increases. It should be noted that the height T2 of the bottom surface of the groove section Y and the height T1 of the first wall 11 can be measured by using, for example, the upper surface of the base 13 (the bottom surface of the recess X) as a reference. It should also be noted that, besides a blade, the groove can also be formed using a laser.

Step of Disposing Second Wall 12

Next, as shown in FIG. 1E, the second wall 12 is disposed inside the groove section Y. The second wall 12 is preferably made using a resin material containing a light-reflecting substance. As the resin material and the light-reflecting substance, a same material and a same substance as the material and the substance used in the first wall 11 can be used. The second wall 12 can be disposed by methods such as potting and compression molding. When compression molding is used, after the compression molding, upper surfaces of the second wall 12 and the sealing member 30 may be made flush with each other by polishing the upper surface of the second wall 12.

Step of Cutting Second Wall 12 and Substrate 10

Next, as shown in FIG. 1F, the second wall 12 and the substrate 10 are cut at a position including the second wall 12. Cutting at a position including the second wall 12 means to cut so that the inside lateral surface of the groove section Y is covered by a part of the second wall 12 or, in other words, cut so that a part of the second wall 12 remains adhered to the inside lateral surface of the groove section Y. In addition, cutting the substrate 10 means to cut the first wall 11 and the base 13, and cutting the base 13 means to cut one of or both the supporting part 131 and the electrode section 132 so as to singulate the substrate 10. Due to the present step, the substrate 10 is singulated in a state where the lateral surface of the sealing member 30 is covered by the second wall 12. In other words, due to the present step, a part of the second wall 12 which is arranged inside the groove section Y as well as a part of the first wall 11 and a part of the base 13 which are arranged below the part of the second wall 12 are removed so as to create a state where the lateral surface of the sealing member 30 is covered by the second wall 12 and, accordingly, the substrate 10 is singulated and one or more light-emitting devices 1 is obtained. After cutting, a thickness W3 of the second wall 12 which covers the lateral surface of the sealing member 30 is small and is around, for example, 80 µm. A blade, a laser, or the like can be used for cutting.

With the manufacturing method of the light-emitting device 1 according to the first embodiment described above, the light-emitting device 1 in which the lateral surface of the sealing member 30 is covered by the second wall 12 with a relatively small thickness W3 and which is configured so as to enable miniaturization and manufacture by a simple method. Therefore, the light-emitting device 1 configured so as to enable miniaturization and efficient manufacturing.

Light Emitting Device 1 According to First Embodiment

FIG. 2 is a schematic sectional view showing the light-emitting device 1 according to the first embodiment. As shown in FIG. 2, the light-emitting device 1 according to the first embodiment includes: the base 13; the first wall 11 arranged on an upper surface of the base 13; the second wall 12 arranged on an upper surface of the first wall 11; the recess X having a lateral surface of the first wall 11 and a lateral surface of the second wall 12 as an inside lateral surface and the upper surface of the base 13 as a bottom surface; the light-emitting element 20 mounted on the bottom surface of the recess X; and the sealing member 30 arranged in the recess X. The sealing member 30 covers the light-emitting element 20 and, at the same time, covers an inside lateral surface and the upper surface of the first wall 11 and an inside lateral surface of the second wall 12. Since other members and sections such as the base 13 and the first wall 11 share the same configurations as the members and sections in the manufacturing method described earlier, a description thereof will be omitted. With the light-emitting device according to the first embodiment, since a distance (for example, a shortest distance) between the light-emitting element 20 and the first wall 11 can be further reduced, the light-emitting device can be miniaturized.

While an embodiment has been described above, the description is not intended to limit in any way the configurations described in the claims.

What is claimed is:

1. A manufacturing method of a light-emitting device, comprising the steps of:
   preparing a substrate provided with a base, a first wall formed on an upper surface of the base, and a recess defined by a lateral surface of the first wall as an inside lateral surface and the upper surface of the base as a bottom surface;
   mounting a light-emitting element on the bottom surface of the recess;
   disposing a sealing member which covers the light-emitting element and the first wall;
   forming a groove section extending from an upper surface of the sealing member to the first wall by removing the sealing member on the first wall;
   disposing a second wall inside the groove section; and
   cutting the second wall and the substrate at a position including the second wall.

2. The manufacturing method of a light-emitting device according to claim 1, wherein
   in the step of preparing a substrate, the upper surface of the first wall is lower in height than an upper surface of the light-emitting element that is mounted on the bottom surface of the recess.

3. The manufacturing method of a light-emitting device according to claim 2, wherein
   in the step of preparing a substrate, a shape of the first wall in a sectional view is a trapezoidal shape.

4. The manufacturing method of a light-emitting device according to claim 2, wherein
   in the step of preparing a substrate,
   the base has an electrode section that is exposed on the bottom surface of the recess, and
   the first wall is formed on the electrode section.

5. The manufacturing method of a light-emitting device according to claim 2, wherein
   in the step of disposing a sealing member, the sealing member is made of a resin material containing a phosphor.

6. The manufacturing method of a light-emitting device according to claim 2, wherein
   in the step of preparing a substrate, the first wall contains a light-reflecting substance.

7. The manufacturing method of a light-emitting device according to claim 2, wherein
in the step of disposing a second wall, the second wall is made of a resin material containing a light-reflecting substance.

8. The manufacturing method of a light-emitting device according to claim 1, wherein
in the step of preparing a substrate, a shape of the first wall in a sectional view is a trapezoidal shape.

9. The manufacturing method of a light-emitting device according to claim 3, wherein
in the step of preparing a substrate,
the base has an electrode section that is exposed on the bottom surface of the recess, and
the first wall is formed on the electrode section.

10. The manufacturing method of a light-emitting device according to claim 8, wherein
in the step of disposing a sealing member, the sealing member is made of a resin material containing a phosphor.

11. The manufacturing method of a light-emitting device according to claim 8, wherein
in the step of preparing a substrate, the first wall contains a light-reflecting substance.

12. The manufacturing method of a light-emitting device according to claim 8, wherein
in the step of disposing a second wall, the second wall is made of a resin material containing a light-reflecting substance.

13. The manufacturing method of a light-emitting device according to claim 1, wherein
in the step of preparing a substrate,
the base has an electrode section that is exposed on the bottom surface of the recess, and
the first wall is formed on the electrode section.

14. The manufacturing method of a light-emitting device according to claim 13, wherein
in the step of disposing a sealing member, the sealing member is made of a resin material containing a phosphor.

15. The manufacturing method of a light-emitting device according to claim 13, wherein
in the step of preparing a substrate, the first wall contains a light-reflecting substance.

16. The manufacturing method of a light-emitting device according to claim 1, wherein
in the step of disposing a sealing member, the sealing member is made of a resin material containing a phosphor.

17. The manufacturing method of a light-emitting device according to claim 16, wherein
in the step of preparing a substrate, the first wall contains a light-reflecting substance.

18. The manufacturing method of a light-emitting device according to claim 1, wherein
in the step of preparing a substrate, the first wall contains a light-reflecting substance.

19. The manufacturing method of a light-emitting device according to claim 1, wherein
in the step of disposing a second wall, the second wall is made of a resin material containing a light-reflecting substance.

* * * * *